United States Patent

Manjo et al.

Patent Number: 5,263,197
Date of Patent: Nov. 16, 1993

[54] DUAL PORT OSCILLATOR FOR TWO-STAGE DIRECT CONVERSION RECEIVER

[75] Inventors: Yoshiharu Manjo, Acworth; Charles R. McMurray, Marietta, both of Ga.; Tadashi Ohga, Yokohama, Japan

[73] Assignee: Matsushita Communication Industrial Corporation of America, Peachtree City, Ga.

[21] Appl. No.: 762,759

[22] Filed: Sep. 20, 1991

[51] Int. Cl.$^5$ .............................................. H04B 1/26
[52] U.S. Cl. .................... 455/324; 455/333; 331/60; 331/116 R
[58] Field of Search ............... 455/324, 314, 316, 317, 455/318, 319, 320, 321, 331, 333; 331/60, 116 R, 116 FE, 158

[56] References Cited

U.S. PATENT DOCUMENTS

| | | | |
|---|---|---|---|
| 3,745,480 | 7/1973 | Putzer | 331/60 |
| 4,855,835 | 8/1989 | Tobita | 455/316 |
| 5,160,901 | 11/1992 | Stone | 331/60 |

Primary Examiner—Reinhard J. Eisenzopf
Assistant Examiner—Philip J. Sobutka
Attorney, Agent, or Firm—Jones & Askew

[57] ABSTRACT

A two-stage direct conversion receiver. A first mixer (13) converts the incoming signal to an intermediate frequency (IF) signal. A second mixer (16) converts the IF signal to a baseband signal. A detector (17), receiver logic circuit (18), and alerting device circuit (19) act upon the baseband output signal. A two port oscillator (14) provides a fundamental frequency output (FO) and a tripled output frequency (3 FO). The tripled output frequency is again tripled (9 FO) by a frequency multiplier (15) and is provided as a mixing signal to the first mixer (13). The fundamental frequency output is provided to a phase locked loop (20, 21, 22). The output frequency (FV) of the phase locked loop is doubled (2 FV) by a frequency multiplier (23) and provided to a phase shift circuit (24). The output of the phase shift circuit (24) is provided as the second mixing signal to the second mixer (16). The phase locked loop comprises a phase locked loop controller (20), a phase locked loop filter (21), and a voltage controlled oscillator (22). The main oscillator (14) is configured as a crystal controlled Colpitts oscillator, which has an emitter resonant circuit selected to produce oscillation at the fundamental frequency, and a collector resonant circuit selected to extract the third harmonic of the fundamental oscillation frequency. A single active device can therefore provide both the fundamental frequency and the third harmonic frequency. Calibration of the receiver is effected by simply tuning the oscillator (14) to produce a baseband output signal at the output of the second mixer (16). Single step calibration is therefore effected because the voltage controlled oscillator (22) is locked to the main oscillator (14).

20 Claims, 2 Drawing Sheets

DUAL PORT OSCILLATOR FOR TWO-STAGE DIRECT CONVERSION RECEIVER

TECHNICAL FIELD

The present invention relates to oscillators and direct conversion receivers and, more particularly, to a dual port oscillator for a two-stage direct conversion receiver.

BACKGROUND OF THE INVENTION

The basic principles of operation and design of personal pagers are well known to those of skill in the art. In general, a pager contains a receiver which monitors a selected frequency or channel, and an alerting device, which alerts the user that some action needs to be taken. The alerting device may be a simple vibrator, a tone generator, an LED, or a display which indicates the telephone number to be called. Also, the pager may only operate on a single frequency or may be programmable to operate on a selected one of a predetermined set of frequencies.

It is desirable that pagers consume the minimum amount of power so that small batteries can be used and so that the batteries need to be infrequently changed. The alerting device is only activated in response to an incoming signal directed (addressed) to that pager and so the power drain of the alerting device is generally inconsequential. However, the power consumption of the receiver is significant. Therefore, in order to maximize battery life, it is necessary to minimize the power consumption of the receiver.

Furthermore, it is desired that the parts count and size be minimized so that the pager may be conveniently placed in a shirt pocket, hooked on a belt, attached to a purse, etc. Also, it is always desirable to minimize the cost of any device.

A direct conversion receiver uses a local oscillator and a mixer to produce a baseband output signal from an incoming signal. In these receivers the local oscillator frequency is the same as the frequency of the signal carrier. This type of direct conversion receiver is well known to those of skill in the art.

Because of the frequency used for paging signals, typically between 929 and 932 MHz, a frequency synthesizer is desirable for convenient selection of the monitored frequency or channel. Furthermore, to reduce the parts count, cost, and receiver size, a direct conversion receiver is desirable. However, a 930 MHz frequency synthesizer would consume a large amount of current, thereby reducing battery life.

Therefore, there is a need for a direct conversion receiver which minimizes parts count, cost, size, and battery current drain.

In addition, there is a need for a frequency synthesizer for a direct conversion receiver which has low power consumption, low parts count, frequency stability, and a programmable output frequency for channel selection.

Two-stage direct conversion receivers use two local oscillators and mixers to produce a baseband signal from the incoming signal. The first local oscillator produces a first oscillator signal that has a frequency that is different from the frequency of the carrier of the input signal. The first local oscillator signal and the incoming signal are mixed in the first mixer to produce an intermediate frequency (IF) signal. The second local oscillator produces a second local oscillator signal that has a frequency that is the same as the frequency of the carrier of the IF signal. The second local oscillator signal and the IF signal are mixed in the second mixer to produce a baseband output signal. This type of two-stage direct conversion receiver is also well known to those with skill in the art. The baseband output signal is then provided to a circuit which uses the signal, such as an amplifier, logic circuit, and/or alerting device.

However, for channel selection purposes, it is desired that the frequency of oscillation of one of the oscillators be selectable (frequency agile) and the frequency of oscillation of the other oscillator be fixed and highly stable. It is possible to use two crystal controlled oscillators to achieve this purpose, with one of the crystals providing a reference for frequency synthesis by a programmable oscillator. However, the component count and cost would be higher than desired. Also, a two-step calibration procedure would be required because each oscillator would have to be tuned independently.

Therefore, there is a need for a circuit that produces two non-harmonic oscillation frequencies from one crystal while maintaining frequency coherence between the two oscillations.

Furthermore, in a two-stage direct conversion receiver it is beneficial for the two oscillators to track each other to provide for easier tuning. Therefore, there is a need for an oscillator for a two-stage direct conversion receiver which has minimal parts count and provides for satisfactory frequency stability.

SUMMARY OF THE INVENTION

The present invention is a two-stage direct conversion receiver having a first mixer, a second mixer, and a single stage, dual port oscillator which provides frequency coherent signals for both the first and second mixers.

More particularly, the oscillator has an amplifying device, such as a transistor, connected to three resonant circuits. The first resonant circuit is a crystal for setting the fundamental or characteristic frequency of the oscillator, the second resonant circuit is a tuned circuit, tuned so as to allow the amplifying device to function as an oscillator, and the third resonant circuit is also a tuned circuit, tuned to a multiple of the fundamental frequency, so that the oscillator also provides an output signal at a specified harmonic of the fundamental frequency. The harmonic frequency is then multiplied to produce the first local oscillator signal which, when mixed with the incoming signal, produces the IF signal. The fundamental frequency is used as the reference frequency for a phase locked loop that provides the second local oscillator frequency which, when doubled and mixed with the IF signal, produces the baseband output signal. Therefore, the receiver is implemented using a single crystal oscillator, a phase locked loop, and two mixers.

The present invention provides for the generation of two non-harmonic frequency signals, which are frequency coherent, but are not harmonically related. A crystal oscillator is used to generate a first output signal and a reference signal. The reference signal is provided to a phase locked loop which generates an output signal which is locked in a predetermined relationship to the reference signal but is not harmonically related to the reference signal.

Therefore, it is an object of the present invention to produce two stable, frequency coherent, non-harmonically related output signals using a single crystal oscillator.

Therefore, it is an object of the present invention to provide a two-stage direct conversion receiver which has minimal parts count.

It is a further object of the present invention to provide a dual port oscillator for use with a two-stage direct conversion receiver.

It is another object of the present invention to provide a single stage oscillator which has a first port for providing a first fundamental output frequency and a second port for providing a harmonic of the output frequency, thereby eliminating the need for a frequency multiplier or reducing the number of frequency multipliers necessary.

It is another object of the present invention to provide a two-stage direct conversion receiver wherein the frequency used to generate the second local oscillator signal is locked to the frequency used to generate the first local oscillator signal.

It is another object of the present invention to provide a two-stage direct conversion receiver which can be calibrated in a single step by adjusting the frequency of a single oscillator.

DETAILED DESCRIPTION

Figure 1:
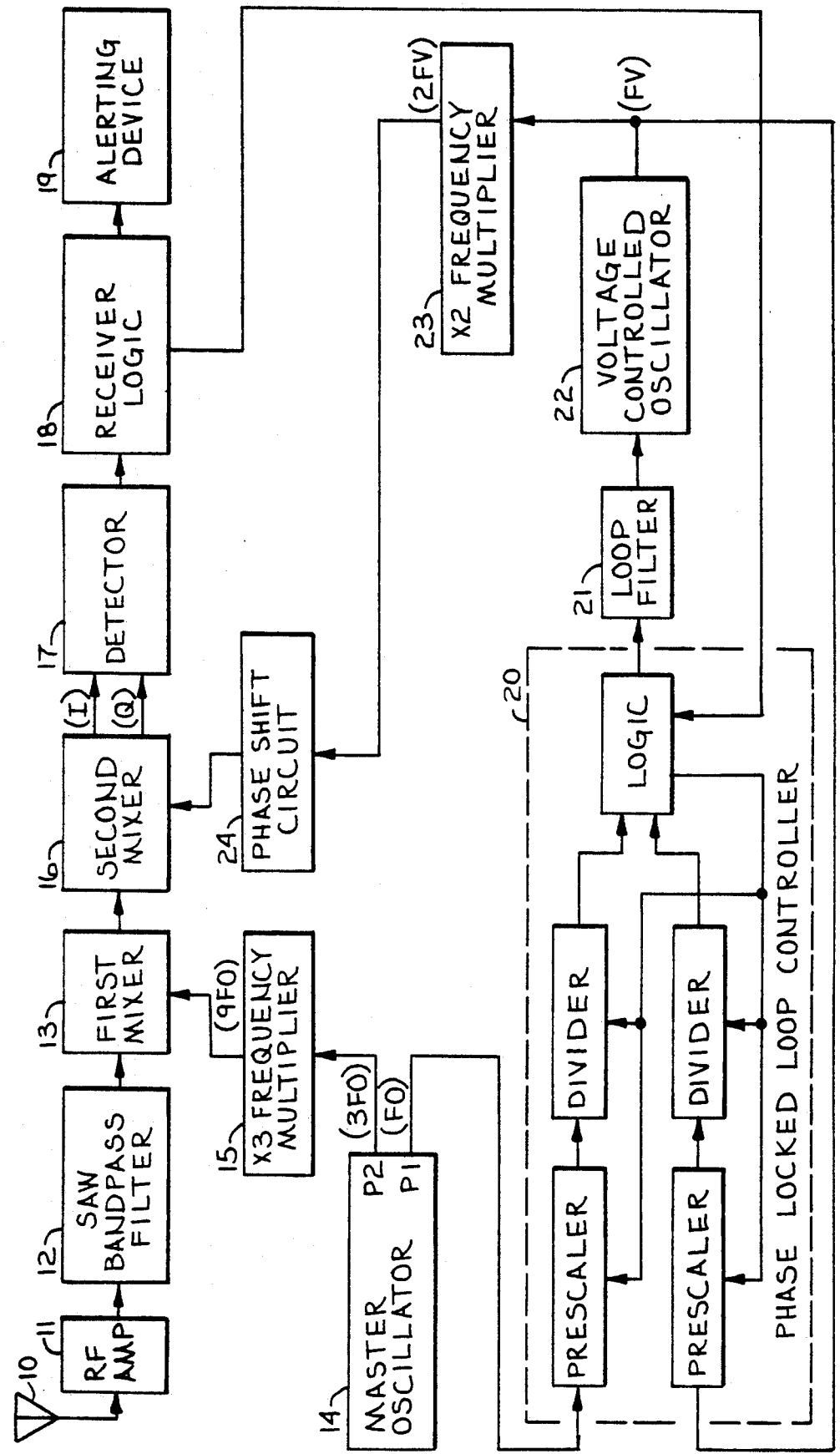
FIG. 1 is a block diagram of the preferred embodiment of the two-stage direct conversion receiver of the present invention.

Turn now to the drawing which like numerals represent like components throughout the several figures. FIG. 1 is a block diagram of the preferred embodiment of the two-stage direct conversion receiver of the present invention. The antenna 10 is connected to the input of an RF amplifier 11, the output of which is connected to the input of a surface acoustic wave (SAW) bandpass filter 12. The frequencies of interest for a pager are typically 929.0125-931.9875 MHz. Therefore, filter 12 has a nominal center frequency of 930 MHz and a bandpass of approximately 30 MHz. The output of filter 12 is connected to one input of the first mixer 13. A dual-port oscillator 14 provides two outputs. The first output (P1) provides an output at the fundamental frequency (FO) and the second port (P2) provides an output at three times the fundamental frequency (3 FO). The output of port P2 of oscillator 14 is connected to the input of a frequency multiplier 15, which multiplies the frequency by a factor of three to provide an output at nine times the fundamental frequency (9 FO). The output of frequency multiplier 15 is connected to the second input of first mixer 13. In the preferred embodiment, frequency FO is 86.9125 MHz, the frequency of the port P2 output of oscillator 14 is 260.7375 MHz, and the output of frequency multiplier 15 has a frequency of 782.2125 MHz. First mixer 13 therefore performs a partial down conversion of the input signal and provides an intermediate frequency (IF) signal having a frequency in the range of 146.8 to 149.775 MHz.

The IF output of first mixer 13 is provided to one input of a second mixer 16. Second mixer 16 completes the down conversion process so that the outputs of second mixer 16 are baseband I and Q signals. The I and Q signals are provided to the inputs of detector 17. Detector 17 detects the phase change between the I and Q signals and provides a phase change output signal to receiver logic 18. Receiver logic 18 decodes the phase change output signal provided by detector 17, determines whether the signal is addressed to that particular device, which in the preferred environment is a pager, and, if so, sends an alert signal to alerting device 19. Alerting device 19 signals the user that a message has been received. The particular means and method used to signal the user may be a vibrator, a tone oscillator, a steady or flashing light, a display of the message, such as a telephone number, etc. The design and construction of detector 17, receiver logic 18 and alerting device 19 are well known to those of skill in the art.

The port P1 output of oscillator 14 is connected to one input of a phase locked loop (PLL) controller 20. The output of PLL controller 20 is connected to the input of a PLL loop filter 21. Loop filter 21 has two poles and a zero. The first pole is at approximately 350 Hz, the zero is between 350 Hz and 1 KHz, and the second pole is between 1 KHz and 4 KHz. The output of loop filter 21 is connected to the input of a variable frequency oscillator, such as voltage controlled oscillator (VCO) 22. The output of VCO 22 is connected to the second input of PLL 20 and also to the input of a frequency multiplier 23, which doubles the frequency. The frequency of the output signal of VCO 22 is controlled by the input voltage provided by loop filter 21. The design, construction and use of a PLL controller, a loop filter, and a VCO to generate a signal that has a frequency that is locked in a preselected relationship to the frequency of another signal is well known to those with skill in the art. In the preferred embodiment, the output of VCO 22 has a frequency (FV) of 73.4 to 74.8875 MHz. The particular output frequency of VCO 22 is determined by the frequency (or channel) of the desired incoming signal. Frequency FV can be selected in 12.5 KHz increments.

In the preferred embodiment, receiver logic 18 determines the channel to which the pager is tuned. Receiver logic 18 typically contains a microprocessor and some type of read only memory having the program for the microprocessor. The program contains an indication of the channel number on which the pager should listen. Receiver logic 18 sends the channel information to PLL controller 20. The channel information is preferably an indication of the scale factors used for the FO and FV inputs.

In the preferred embodiment, PLL controller 20 has a dual modulus prescaler and a divider for each input (FO and FV). In response to the channel information provided by receiver logic 18, PLL controller 20 will set the number of times for division by the first modulus, the number of times for division by the second modulus, and the scale factor (1/N) for the divider necessary to divide each input signal (FO, FV) to arrive at the frequency desired for comparison of the two input signals. In the preferred embodiment, the two modulus factors are 16 and 17, N is between 734 and 748 for FV, and N is 869 for FO, to yield a scaled down phase comparison frequency of 6.25 KHz.

The output of frequency multiplier (doubler) 23 is the same as the IF frequency, that is, 146.8 to 149.775 MHz, in 25 KHz steps, which matches the 25 KHz channel spacing. The output of frequency multiplier 23 is provided to the input of a phase shift circuit 24. In the preferred embodiment, circuit 24 phase shifts the output signal of frequency multiplier 23 to provide two signals that have the same frequency but differ in phase by 90°. These two signals are used by second mixer 16 to split the IF signal from first mixer 13 into baseband inphase (I) and quadrature (Q) phase signals. The design and construction of phase shift circuits, such as circuit 24, are well known to those with skill in the art. It will be noted that the frequency of the output of first mixer 13 is the same as the frequency of the output of frequency multiplier 23 and phase shift circuit 24. Therefore, second mixer 16 performs a direct conversion of the received signal from the IF frequency to the baseband frequency.

The receiver of FIG. 1 therefore performs a first down conversion (via first mixer 13) to the IF frequency, and performs a second direct conversion (via second mixer 16) to the baseband signal. Furthermore, oscillator 14 performs as a master oscillator which provides a first output FO (via port P1) that is used to derive the second input to second mixer 16, and has a second port P2 that has an output frequency of 3 FO and is used to generate the second input signal (9 FO) for first mixer 13.

The use of a two-stage direct conversion receiver provides better frequency stability and better phase stability than a single-stage direct conversion receiver with a VCO output that is frequency multiplied up to the 930 MHz band. The use of a low frequency (74 MHz band) VCO provides for less power consumption than a 930 MHz band VCO. The use of a crystal oscillator to provide both the mixing signal for the first mixer and a reference frequency for a PLL VCO oscillator 22 provides better frequency coherence than using two independent oscillators.

The frequency of the referenced oscillator 14 and the frequency of the VCO 22 have been selected so that: (1) there are no harmonics of either oscillator that fall in the 930 MHz signal band, thereby allowing for the SAW filter to attenuate any spurious harmonics; and (2) there are no harmonics of the referenced oscillator 14 which fall in the 150 MHz IF band, thereby eliminating reception problems caused by strong spurious harmonics. It will be noted that the harmonics of the 86.9125 MHz oscillation fall outside the bandpass of SAW filter 12, as do the harmonics of VCO 22. In addition, it will be noted that products formed by mixing the fundamentals and/or harmonics of the two oscillation frequencies will produce a non-baseband signal that, if necessary, can be easily removed by filtering.

Figure 2:
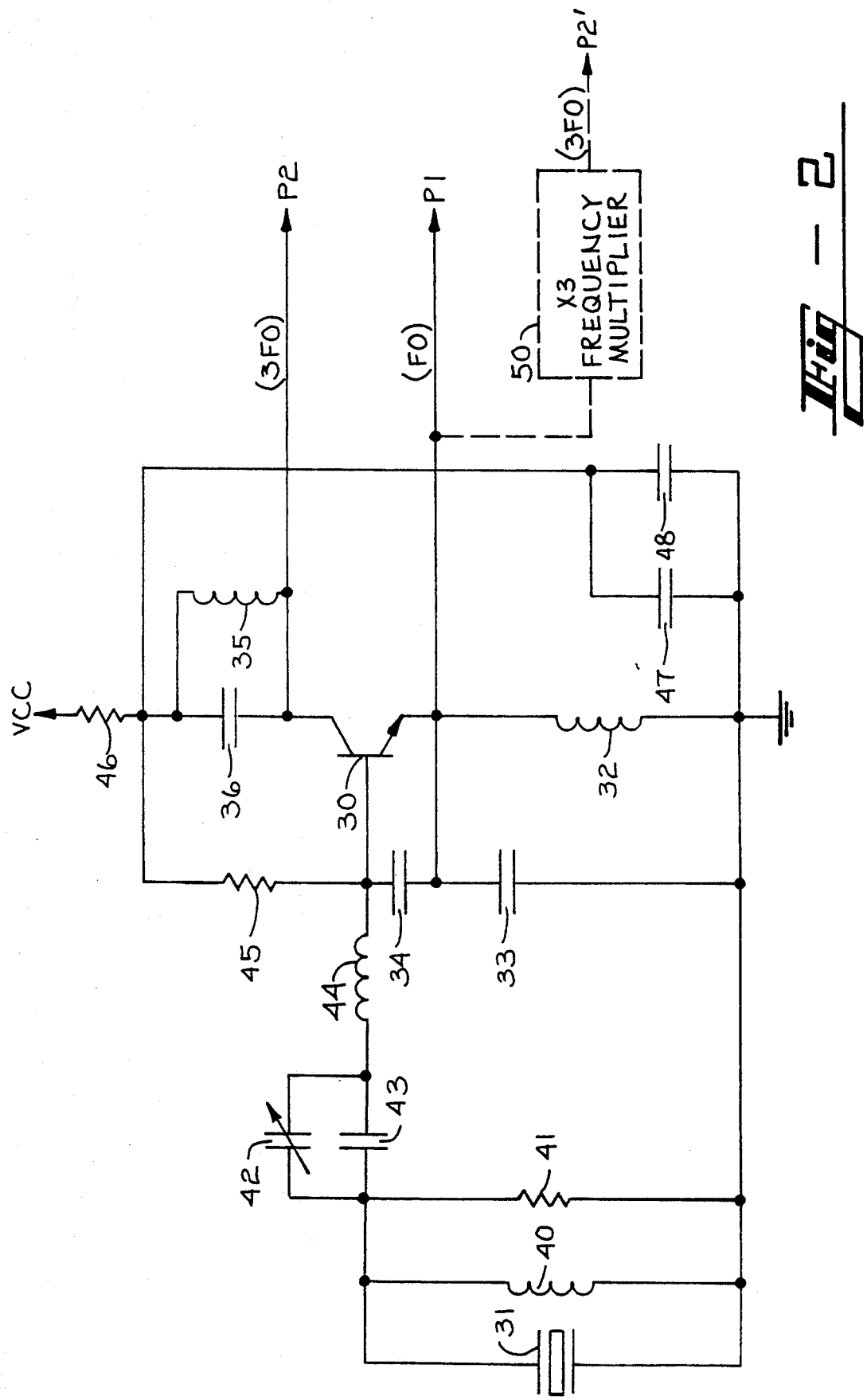
FIG. 2 is a schematic diagram of the preferred embodiment of the single-stage dual port oscillator of the present invention.

Turn now to FIG. 2 which is a schematic diagram of the preferred embodiment of the single stage dual-port oscillator of the present invention. Oscillator 14 has a single amplifying device, transistor 30, the frequency of oscillation of which is primarily controlled by an 86.9125 MHz crystal 31. Transistor 30 is, on the one hand, configured as a Colpitts oscillator and, on the other hand, configured as a frequency multiplier. The emitter of NPN transistor 30 is connected to one end of inductor 32 and capacitors 33 and 34. The emitter of transistor 30 also is the first port (P1) output of oscillator 14. The other ends of components 32 and 33 are connected to ground whereas the other end of capacitor 34 is connected to the base of transistor 30. The base of transistor 30 is further connected to one end of a bias resistor 45 and a choke 44. Choke 44 is used to prevent spurious oscillations. The other end of choke 44 is connected to one end of variable capacitor 42, which is used for precise setting of the frequency of oscillation, and to one end of capacitor 43. The other ends of components 42 and 43 are connected to one end of crystal 31, inductor 40, and resistor 41. The other ends of components 31, 40 and 41 are connected to circuit ground. The collector of transistor 30 is connected to one end of inductor 35 and capacitor 36. The collector of transistor 30 is the port P2 output of oscillator 14 and has a frequency of 3 FO. The other ends of components 35, 36, and 45 are connected to a supply voltage (VCC) via a decoupling resistor 46. The junction of components 35, 36, 45 and 46 is connected to circuit ground through the parallel combination of decoupling capacitors 47 and 48.

The fundamental frequency of operation (FO) is primarily determined by crystal 31, capacitors 33, 34, 42 and 43, and inductor 32. At the 86.9125 MHz fundamental frequency the tuned circuit represented by inductor 35 and capacitor 36, in conjuction with decoupling capacitors 47 and 48, presents a short circuit between the collector of transistor 30 and circuit ground. Therefore, transistor 30 is able to operate as a Colpitts oscillator. The resonant circuit represented by components 32 and 33 acts as a filter which attenuates or traps the harmonics so that the output signal at port P1 is primarily at frequency FO. However, at three times the fundamental frequency the tuned circuit represented by inductor 32 and capacitor 33 presents a short between the emitter of transistor 30 and circuit ground. Therefore, transistor 30 is also able to operate as a common emitter amplifier, and in this case is used as a common emitter frequency multiplier. It will be appreciated that the fundamental frequency and numerous harmonics are generated by the typical oscillator. The resonant circuit represented by inductor 35 and capacitor 36 is tuned to the third harmonic and therefore acts as a filter which attenuates or traps the fundamental frequency, the second harmonic, and the fourth and higher order harmonics, so that the output signal at port P2 is primarily at frequency 3 FO. Therefore, oscillator 14 has three resonant circuits and an amplifying device (transistor 30). One resonant circuit is represented by crystal 31, inductors 40 and 44, and capacitors 42 and 43, another resonant circuit is represented by inductor 32 and capacitor 33, and another resonant circuit is represented by inductor 35 and capacitor 36. Capacitor 34 is necessary for operation as a Colpitts oscillator and has an effect on the frequency of oscillation. The resonant circuits allow different frequencies to be provided from the emitter and collector of transistor 30, thereby allowing oscillator 14 to function as a dual-port oscillator.

Of course, it will be appreciated that, if desired, inductor 35 and capacitor 36 may be eliminated (replaced by a short circuit) so that oscillator 14 merely functions as single-port oscillator having only one output port P1 having an output frequency of FO. In this case, a second frequency multiplier 50, shown in phantom, would be used to multiply the frequency by three so as to provide the desired output frequency on port P2'. However, this requires an additional frequency multiplier, increases the parts count, cost, and power consumption, and is considered to be a less desirable method of operation.

Component values for oscillator 14 are as follows. Crystal 31 has a fundamental or characteristic frequency of 86.9125 MHz. Transistor 30 is a type 2SC4228. Resistors 41, 45, and 46 have values of 680, 22k, and 220 ohms, respectively. Inductors 32, 35 and 40 have values of 0.47 microhenries, 19 nanohenries and 0.68 microhenries, respectively. Capacitors 33, 34, 36, 43, 47 and 48 have values of 18 picofarads, 12 picofarads, 10 picofarads, 3 picofarads, 1000 picofarads, and 0.1 microfarads, respectively. Capacitor 42 is a 20 picofarad variable capacitor and is used to set the frequency of crystal 31 to exactly 86.9125 MHz. Choke 44 has a value of approximately 1 microhenry, the value is not critical.

Referring back to FIG. 1, it will be noted that the frequency of oscillation of VCO 22 is locked in a predetermined relationship to the frequency of oscillator 14 by PLL controller 20. Therefore, calibration of the receiver is accomplished in a single step by adjusting the frequency of oscillator 14, using capacitor 42, so that baseband signals are provided on the I and Q outputs of second mixer 16. Therefore, it is only necessary, for proper operation, that oscillator 14 be stable because oscillator 22 is forced to track oscillator 14. Therefore, the use of this dual port oscillator reduces the number of high precision oscillators that are necessary for proper operation of the receiver.

In addition, although the preferred environment for the present invention is in a receiver, it will be appreciated that the single crystal oscillator/phase locked loop combination represented by components 14, 20, 21 and 22 is also useful in other applications, such as in a transmitter where it is desired to maintain frequency coherence between a primary carrier and a subcarrier.

Variations of the preferred embodiment will be apparent to those of skill in the art from a reading of the detailed description above in conjunction with the drawing. Therefore, the scope of the present invention is to be limited by the claims below.

We claim:

1. An oscillator, comprising:
   an amplifying device having an input terminal, a first output terminal, and a second output terminal;
   a crystal, having a predetermined characteristic frequency, functionally connected to said input terminal;
   a first resonant circuit, having a resonant frequency selected to cause said amplifying device to oscillate only at approximately said predetermined characteristic frequency, and functionally connected to said first output terminal; and
   a second resonant circuit, having a resonant frequency being approximately N times said predetermined characteristic frequency, and being functionally connected to said second output terminal, N being an integer greater than one;
   wherein said first output terminal primarily provides a first output signal having a frequency approximately the same as said predetermined characteristic frequency, and said second output terminal primarily provides a second output signal having a frequency approximately N times said predetermined characteristic frequency.

2. The oscillator of claim 1 wherein said amplifying device is a transistor.

3. An oscillator, comprising:
   an amplifying device having an input terminal, a first output terminal, and a second output terminal, wherein said amplifying device is a transistor having a base for said input terminal, an emitter for said first output terminal, and a collector for said second output terminal;
   a crystal, having a predetermined characteristic frequency, functionally connected to said input terminal;
   a first resonant circuit, having a resonant frequency selected to cause said amplifying device to oscillate at approximately said predetermined characteristic frequency, and functionally connected to said first output terminal; and
   a second resonant circuit, having a resonant frequency being approximately N times said predetermined characteristic frequency, and being functionally connected to said second output terminal, N being an integer greater than one;
   wherein said first output terminal provides a first output signal having a frequency approximately the same as said predetermined characteristic frequency, and said second output terminal provides a second output signal having a frequency approximately N times said predetermined characteristic frequency.

4. A direct conversion receiver, comprising:
   a first mixer responsive to an input signal and a first mixing signal for providing an intermediate frequency (IF) output signal;
   a first oscillator for providing a first oscillator signal to said first mixer as said first mixing signal;
   a second mixer responsive to said IF output signal and a second mixing signal for providing a baseband output signal;
   a second oscillator for providing a second oscillator signal to said second mixer as said second mixing signal; and
   locking means for locking said second oscillator signal in a predetermined relationship to said first oscillator signal.

5. The direct conversion receiver of claim 4 and further comprising:
   frequency multiplying means connected between said first oscillator and said first mixer for providing said first mixing signal by multiplying the frequency of said first oscillator signal by M, where M is an integer greater than one.

6. A direct conversion receiver, comprising:
   a first mixer responsive to an input signal and a first mixing signal for providing an intermediate frequency (IF) output signal;
   a first oscillator for providing a first oscillator signal to said first mixer as said first mixing signal;
   a second mixer responsive to said IF output signal and a second mixing signal for providing a baseband output signal;
   a second oscillator for providing a second oscillator signal to said second mixer as said second mixing signal; and
   locking means for locking said second oscillator signal in a predetermined relationship to said first oscillator signal;
   wherein said first oscillator has a first port for providing a reference signal to said locking means and a second port for providing said first oscillator signal.

7. A direct conversion receiver, comprising:
   a first mixer responsive to an input signal and a first mixing signal for providing an intermediate frequency (IF) output signal;
   a first oscillator for providing a first oscillator signal to said first mixer as said first mixing signal;
   a second mixer responsive to said IF output signal and a second mixing signal for providing a baseband output signal;
   a second oscillator for providing a second oscillator signal to said second mixer as said second mixing signal; and locking means for locking said second oscillator signal in a predetermined relationship to said first oscillator signal;

wherein said first oscillator has a first port for providing a reference signal having a first frequency to said locking means, and a second port for providing said first oscillator signal having a frequency of N times said first frequency, where N is an integer greater than 1.

8. The direct conversion receiver of claim 7 wherein said first oscillator comprises:

an amplifying device having an input terminal, a first output terminal, and a second output terminal;

a crystal, having a predetermined characteristic frequency, functionally connected to said input terminal;

a first resonant circuit, having a resonant frequency selected to cause said amplifying device to oscillate at said predetermined characteristic frequency, functionally connected to said first output terminal; and a second resonant circuit, having a resonant frequency being approximately N times said predetermined characteristic frequency, functionally to said second output terminal, N being an integer greater than one;

wherein said first output terminal functions as said first port and said second output terminal functions as said second port.

9. The direct conversion receiver of claim 8 wherein said amplifying device is a transistor.

10. The direct conversion receiver of claim 9 wherein said transistor has a base for said input terminal, an emitter for said first output terminal, and a collector for said second output terminal.

11. The direct conversion receiver of claim 4 wherein said locking means comprises a phase locked loop controller.

12. The direct conversion receiver of claim 11 wherein said second oscillator comprises a voltage controlled oscillator.

13. The direct conversion receiver of claim 4 and further comprising:

frequency multiplying means connected between said second oscillator and second mixer for providing said second mixing signal by multiplying the frequency of said second oscillator by M, where M is an integer greater than 1.

14. A precision, multifrequency oscillator circuit, comprising:

a crystal;

a first oscillator, functionally connected to said crystal, for providing a first output signal, said first output signal having a first frequency, said first frequency being determined primarily by said crystal;

a second oscillator, responsive to a frequency control signal, for providing a second output signal, said second output signal having a second frequency, said second frequency being determined by said frequency control signal and being a frequency other than an integer multiple or an integer submultiple of said first frequency; and a controller functionally connected to said first oscillator and said second oscillator for providing said frequency control signal, said frequency control signal being responsive to a relationship between a first scaled signal and a second scaled signal, said first scaled signal having a frequency equal to a first integer submultiple of said first frequency, said second scaled signal having a frequency equal to a second integer submultiple of said second frequency.

15. The oscillator circuit of claim 14 wherein said second oscillator is a voltage controlled oscillator.

16. The oscillator circuit of claim 14 wherein said controller and said second oscillator are embodied in a phase locked loop.

17. The oscillator circuit of claim 14 and further comprising a lowpass filter connected between said controller and said second oscillator for low pass filtering said frequency control signal.

18. The oscillator circuit of claim 14 and further comprising tuning means for precisely setting said first frequency.

19. The oscillator circuit of claim 18 wherein said tuning means comprises a variable capacitor.

20. The oscillator circuit of claim 14 wherein said first oscillator is configured as a Colpitts oscillator.

* * * * *